United States Patent
Namiki et al.

(10) Patent No.: US 8,636,924 B2
(45) Date of Patent: Jan. 28, 2014

(54) ANISOTROPIC CONDUCTIVE ADHESIVE

(75) Inventors: Hidetsugu Namiki, Tochigi (JP); Shiyuki Kanisawa, Tochigi (JP); Genki Katayanagi, Tochigi (JP)

(73) Assignee: Dexerials Corporation, Tokyo (JP)

( * ) Notice: Subject to any disclaimer, the term of this patent is extended or adjusted under 35 U.S.C. 154(b) by 562 days.

(21) Appl. No.: 13/000,866

(22) PCT Filed: Apr. 3, 2009

(86) PCT No.: PCT/JP2009/056936
§ 371 (c)(1),
(2), (4) Date: Jan. 14, 2011

(87) PCT Pub. No.: WO2010/007817
PCT Pub. Date: Jan. 21, 2010

(65) Prior Publication Data
US 2011/0108878 A1    May 12, 2011

(30) Foreign Application Priority Data

Jul. 16, 2008  (JP) ................................. 2008-185322

(51) Int. Cl.
*H01B 1/00*  (2006.01)
*H01L 33/00*  (2010.01)

(52) U.S. Cl.
USPC ........................................... 252/500; 257/99

(58) Field of Classification Search
USPC .................. 252/500–521.6; 257/99
See application file for complete search history.

(56) References Cited

U.S. PATENT DOCUMENTS

| | | |
|---|---|---|
| 6,328,844 B1 | 12/2001 | Watanabe et al. |
| 6,812,065 B1 | 11/2004 | Kitamura |
| 2003/0102466 A1* | 6/2003 | Kumakura et al. ........... 252/511 |
| 2005/0045899 A1 | 3/2005 | Tsutsui |

FOREIGN PATENT DOCUMENTS

| | | |
|---|---|---|
| CN | 1310848 A | 8/2001 |
| EP | 1 120 449 A1 | 8/2001 |

(Continued)

OTHER PUBLICATIONS

Extended European Search Report issued in European Patent Application No. 09797745.8 dated Jun. 14, 2013.

(Continued)

*Primary Examiner* — Mark Kopec
*Assistant Examiner* — Jaison Thomas
(74) *Attorney, Agent, or Firm* — Oliff & Berridge, PLC

(57) ABSTRACT

An anisotropic conductive adhesive includes an epoxy adhesive containing an epoxy compound and a curing agent and conducive particles dispersed in the epoxy adhesive. When elastic moduluses at 35° C., 55° C., 95° C., and 150° C. of a cured product of the anisotropic conductive adhesive are denoted by $EM^{35}$, $EM^{55}$, $EM^{95}$, and $EM^{150}$, respectively, and change rates in the elastic modulus between 55° C. and 95° C. and between 95° C. and 150° C. are denoted by $\Delta EM^{55-95}$ and $\Delta EM^{95-150}$, respectively, the following expressions (1) to (5) are satisfied.

$$700 \text{Mpa} \leq EM^{35} \leq 3000 \text{MPa} \quad (1)$$

$$EM^{150} < EM^{95} < EM^{55} < EM^{35} \quad (2)$$

$$\Delta EM^{55-95} < \Delta EM^{95-150} \quad (3)$$

$$20\% \leq \Delta EM^{55-95} \quad (4)$$

$$40\% \leq \Delta EM^{95-150} \quad (5)$$

11 Claims, 2 Drawing Sheets

(56) References Cited

FOREIGN PATENT DOCUMENTS

| | | |
|---|---|---|
| EP | 1 209 211 A1 | 5/2002 |
| JP | A-50-101863 | 8/1975 |
| JP | A-05-020918 | 1/1993 |
| JP | A-07-090238 | 4/1995 |
| JP | A-09-125018 | 5/1997 |
| JP | A-10-259227 | 9/1998 |
| JP | A-11-256117 | 9/1999 |
| JP | A-11-335641 | 12/1999 |
| JP | A-2000-345010 | 12/2000 |
| JP | A-2001-115127 | 4/2001 |
| JP | A-2002-201450 | 7/2002 |
| JP | B2-3342703 | 11/2002 |
| JP | A-2003-147306 | 5/2003 |
| JP | A-2004-039983 | 2/2004 |
| JP | A-2005-050773 | 2/2005 |
| JP | A-2006-104273 | 4/2006 |
| JP | A-2007-112949 | 5/2007 |
| WO | WO 2008/044330 A1 | 4/2008 |

OTHER PUBLICATIONS

Chinese Office Action issued in Chinese Application No. 200980127919.4 dated Nov. 2, 2012 (w/translation).

International Search Report issued in International Application No. PCT/JP2009/056936, dated Jun. 23, 2009 (with translation).

International Preliminary Report on Patentability issued in International Application No. PCT/JP2009/056936, dated Nov. 17, 2010 (with translation).

Japanese Office Action issued in Japanese Patent Application No. 2008-185322 dated Mar. 6, 2013 (w/translation).

Japanese Submission of Publications and the Like issued in Japanese Patent Application No. 2008-185322 dated Apr. 15, 2011 (w/translation).

* cited by examiner

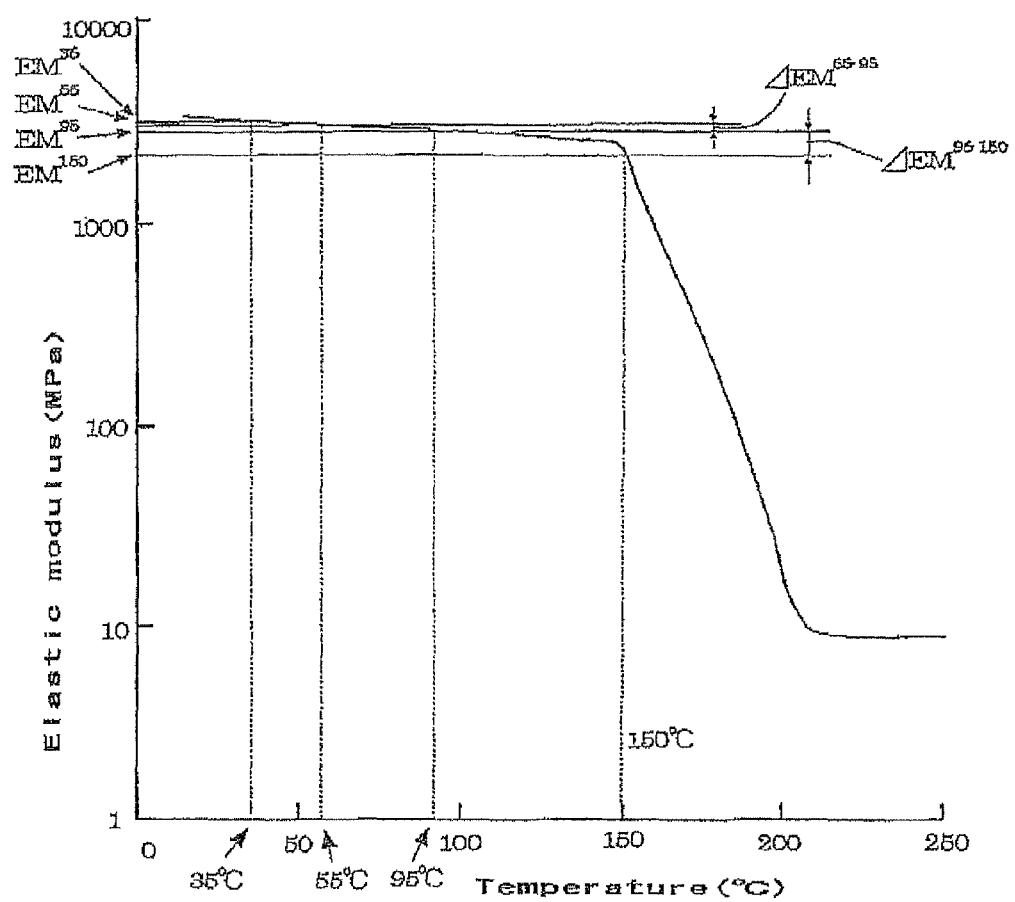

ANISOTROPIC CONDUCTIVE ADHESIVE

TECHNICAL FIELD

The present invention relates to an anisotropic conductive adhesive.

BACKGROUND ART

A widely employed method for mounting a driver IC or a chip part, such as an LED element, on a circuit substrate is to perform flip-chip mounting using an anisotropic conductive film formed by dispersing conductive particles in an epoxy adhesive and molding into a film (Patent Document 1). According to this method, since the chip part can be fixed on the circuit substrate with an epoxy adhesive while simultaneously achieving an electrical connection between the chip part and the circuit substrate with the conductive particles in the anisotropic conductive film, the connection process is short and a high productivity can be realized.

PRIOR ART DOCUMENTS

Patent Documents

[Patent Document 1] Japanese Patent No. 3342703

SUMMARY OF THE INVENTION

Problems to be Solved by the Invention

However, if a reliability test such as a lead-free solder reflow test, a thermal shock test (TCT), a high-temperature high-humidity test, and a pressure cooker test (PCT), is carried out on a mounted product obtained by mounting a chip part on a circuit substrate with an anisotropic conductive film that uses an epoxy adhesive, internal stress is produced due to differences in the thermal expansion coefficient of the circuit substrate and the chip. This can cause the problem that the conduction resistance between the chip and the circuit substrate increases, and can also increase the chances of problems such as the chip part peeling from the circuit substrate occurring. This problem can also occur in LED devices, which have recently been drawing attention as an energy-saving illumination material.

The present invention is directed to resolving the problems in the above-described conventional art. It is an object of the present invention to enable a high conduction reliability between a circuit substrate and a chip part to be maintained, and enable the adhesion between the circuit substrate and the chip part and a cured anisotropic conductive adhesive to be maintained in a good condition, even when a mounted product obtained by mounting a chip part on a circuit substrate with an anisotropic conductive adhesive is subjected to a reliability test that involves heating of the mounted product, such as a lead-free solder reflow test, a thermal shock test (TCT), a high-temperature high-humidity test, and a pressure Cooker test (PCT).

Means for Solving the Problems

To lessen the internal stress produced between the circuit substrate, the chip part, and the cured anisotropic conductive adhesive during a reliability test that involves heating, such as a solder reflow test, the present inventors tried reducing the elastic modulus of the cured anisotropic conductive adhesive. Consequently, the present inventors found that although simply reducing the elastic modulus could be thought to be effective in lessening internal stress, there was the problem that conduction reliability dramatically deteriorates. In view of such circumstances, the present inventors made the unexpected discovery that there is a close relationship between an elastic modulus profile pattern of a curve obtained by plotting elastic modulus versus temperature and the reliability evaluation results of the anisotropic conductive adhesive, and that that relationship could be represented by several relational expressions, thereby completing the present invention.

Specifically, the present invention is an anisotropic conductive adhesive including an epoxy adhesive containing an epoxy compound and a curing agent and conducive particles dispersed in the epoxy adhesive, wherein when elastic moduluses at 35° C., 55° C., 95° C., and 150° C. of a cured product of the anisotropic conductive adhesive are denoted by $EM^{35}$, $EM^{55}$, $EM^{95}$ and $EM^{150}$, respectively, and change rates in the elastic modulus between 55° C. and 95° C. and between 95° C. and 150° C. are denoted by $\Delta EM^{55-95}$ and $\Delta EM^{95-150}$, respectively, the following expressions (1) to (5) are satisfied. Here, the change rates in elastic modulus $\Delta EM^{55-95}$ and $\Delta EM^{95-150}$ are specifically defined by the following expressions (6) and (7), respectively.

Further, the term "elastic modulus" used in the present invention is a numeric value measured based on JIS K7244-4. More specifically, the elastic modulus is a value measured using a dynamic viscoelasticity measuring instrument (for example, DDV-01FP-W, A&D Company) under conditions of tension mode, a frequency of 11 Hz, and a rate of temperature increase of 5° C./minute.

$$700\text{MPa} \leq EM^{35} \leq 3000\text{MPa} \tag{1}$$

$$EM^{150} < EM^{95} < EM^{55} < EM^{35} \tag{2}$$

$$\Delta EM^{55-95} < \Delta EM^{95-150} \tag{3}$$

$$20\% \leq \Delta EM^{55-95} \tag{4}$$

$$40\% \leq \Delta EM^{95-150} \tag{5}$$

$$\Delta EM^{55-95}(\%) = \{(EM^{55} - EM^{95})/EM^{55}\} \times 100 \tag{6}$$

$$\Delta EM^{95-150}(\%) = \{(EM^{95} - EM^{150})/EM^{95}\} \times 100 \tag{7}$$

Furthermore, the present invention provides a connection structure that is formed by flip-chip mounting a chip part on a circuit substrate using the above-described anisotropic conductive adhesive.

Advantages of the Invention

The anisotropic conductive adhesive according to the present invention is prepared such that the cured product thereof has elastic modulus which satisfies the expressions (1) to (5). Therefore, a high conduction reliability between a circuit substrate and a chip part can be maintained, and the adhesion between the circuit substrate and chip part and the cured anisotropic conductive adhesive can be maintained in a good condition, even when a mounted product obtained by mounting the chip part on the circuit substrate with the anisotropic conductive adhesive according to the present invention is subjected to a reliability test that involves heating of the mounted product, such as a lead-free solder reflow test, a thermal shock test (TCT), a high-temperature high-humidity test, and a pressure cooker test (PCT).

BRIEF DESCRIPTION OF THE DRAWINGS

FIG. 2 illustrates an elastic modulus profile with respect to the temperature of a cured product of a conventional anisotropic conductive adhesive.

BEST MODE FOR CARRYING OUT THE INVENTION

Figure 1:
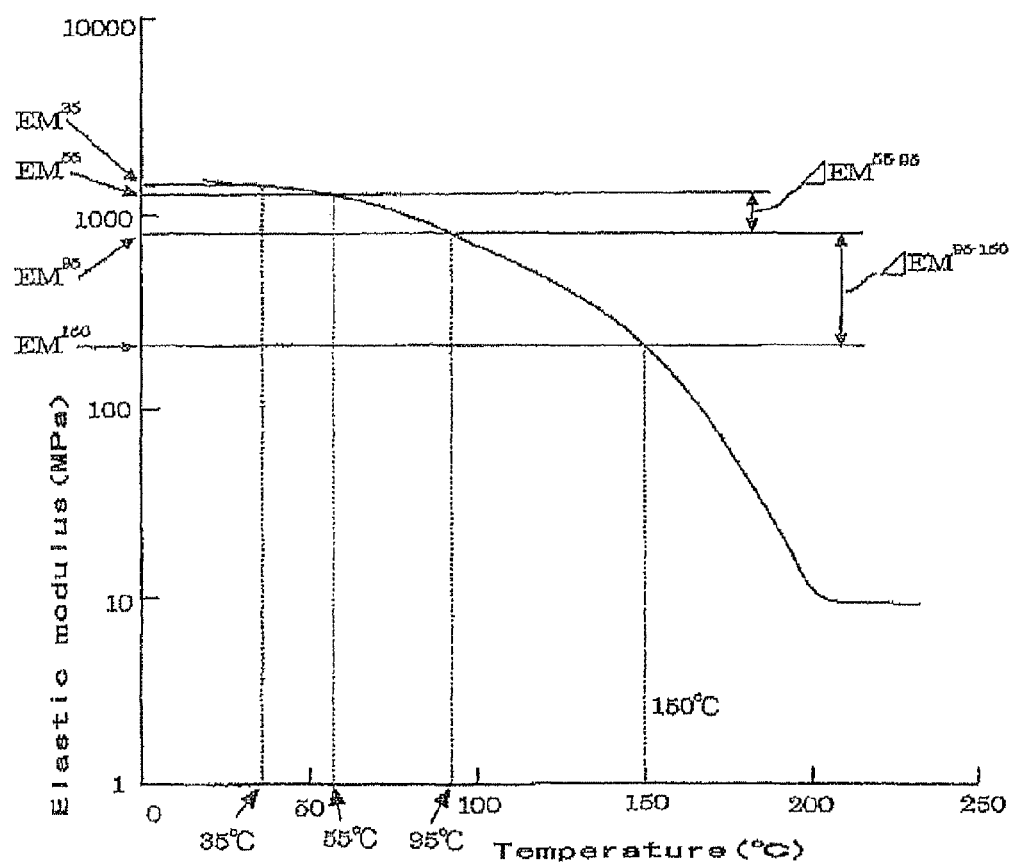
FIG. 1 illustrates an elastic modulus profile with respect to the temperature of a cured product of the anisotropic conductive adhesive according to the present invention.

The anisotropic conductive adhesive according to the present invention has conducive particles dispersed in an epoxy adhesive containing an epoxy compound and a curing agent. When the elastic moduluses at 35° C., 55° C., 95° C., 150° C. of a cured product of the anisotropic conductive adhesive are denoted by $EM^{35}$, $EM^{55}$, $EM^{95}$, and $EM^{150}$, respectively, and the change rates in the elastic modulus between 55° C. and 95° C. and between 95° C. and 150° C. are denoted by $\Delta EM^{55-95}$, and $\Delta EM^{55-150}$, respectively, the above-described expressions (1) to (5) are satisfied.

FIG. 1 illustrates an example of an elastic modulus profile which satisfies these expressions (1) to (5) (the vertical axis represents elastic modulus and the horizontal axis represents temperature). In addition, FIG. 2 illustrates an example of an elastic modulus profile of a conventional anisotropic conductive adhesive. The conventional anisotropic conductive adhesive of FIG. 2 does not contain a predetermined polymer compound. Therefore, although the elastic modulus tends not to change even if the temperature is increased by a certain extent, the elastic modulus tends to suddenly decrease dramatically when a certain temperature is exceeded due to the glass transition temperature being exceeded.

The significance of the above expressions (1) to (5) defining the anisotropic conductive adhesive according to the present invention will now be described in more detail.

The expression (1) illustrates the fact that the elastic modulus at 35° C. of the cured anisotropic conductive adhesive is in the range of 700 MPa to 3000 MPa. Here, the reason why the temperature "35° C." was employed is because generally the relative change for the change in the elastic modulus of a cured epoxy resin at less than 35° C. is small, and can be ignored. Therefore, there is a point in having 35° C. as a reference temperature. Furthermore, if the elastic modulus $EM^{35}$ at 35° C. is less than 700 MPa, a problem occurs with the initial conduction reliability. Moreover, if the elastic modulus $EM^{35}$ is more than 3000 MPa, there is a stronger tendency for a problem to occur with the conduction reliability after a moisture absorption reflow test.

The expression (2) illustrates the fact that the elastic modulus of the cured anisotropic conductive adhesive decreases as the temperature increases from 35° C., 55° C., 95° C., to 150° C. If the elastic modulus does not increase along with the increase in temperature, the internal stress in the adhesive (cured product) increases based on the increase in temperature. Consequently, there is a stronger tendency for problems such as deterioration of the adhesion strength and deterioration of the conduction reliability to occur. Here, the significance of the temperature of 150° C. is not only that this temperature corresponds to the temperature at which an LED device emits light, but also that this is that temperature at which the anisotropic conductive adhesive is heated during solder reflow. In addition, the reason for measuring the elastic modulus at two points, 55° C. and 95° C., between 35° C. and 150° C. is that, when focusing on the relationship between the effects of the present invention and the rate of decrease in elastic modulus, it was found that using a value for the elastic modulus measured at the two points of 55° C. and 95° C. was experimentally sound.

The expression (3) illustrates the fact that the change rate in the elastic modulus between 95° C. and 150° C. $\Delta EM^{95-150}$ is greater than the change rate in elastic modulus between 55° C. and 95° C. $\Delta EM^{55-95}$. If these values are the same, the lessening of internal stress is insufficient, while if this relationship is reversed, there is a stronger tendency for it to be impossible to maintain the conduction reliability.

The expression (4) illustrates the fact that the change rate in elastic modulus between 95° C. and 150° C. $\Delta EM^{55-95}$ is 20% or more. If the change $\Delta EM^{55-95}$ is less than 20%, there is a stronger tendency for it to be impossible to maintain the conduction reliability. The expression (5) illustrates the fact that the change rate in elastic modulus between 95° C. and 150° C. $\Delta EM^{95-150}$ is 40% or more. If the change rate $\Delta EM^{95-150}$ is less than 40%, there is a stronger tendency for it to be impossible to maintain the conduction reliability. Further, a preferred range for $\Delta EM^{55-95}$ and $\Delta EM^{95-150}$ is as shown by the following expressions (4') and (5').

$$20\% \leq \Delta EM^{55-95} \leq 35\% \quad (4')$$

$$40\% \leq \Delta EM^{95-150} \leq 70\% \quad (5')$$

Next, the specific components of the anisotropic conductive adhesive according to the present invention having the above-described elastic modulus characteristics of the cured product will be described. As described above, the anisotropic conductive adhesive according to the present invention has conducive particles dispersed in an epoxy adhesive containing an epoxy compound and a curing agent.

Preferred examples of the epoxy compound include compounds or resins having two or more epoxy groups in their molecules. These may be liquid or solid. Specific examples include known epoxy resins such as glycidyl ethers obtained by reacting epichlorohydrin with a polyhydric phenol such as bisphenol A, bisphenol F, bisphenol S, hexahydrobisphenol A, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methape, bixylenol, phenolnovolac, or cresol-novolac; polyglycidyl ethers obtained by reacting epichlorohydrin with an aliphatic polyhydric alcohol such as glycerin, neopentyl glycol, ethylene glycol, propylene glycol, butylene glycol, hexylene glycol, polyethylene glycol, or polypropylene glycol; glycidyl ether esters obtained by reacting epichlorohydrin with a hydroxycarboxylic acid such as p-oxybenzoic acid or β-oxynaphthoic acid; polyglycidyl esters obtained from polycarboxylic acids such as phthalic acid, methylphthalic acid, isophthalic acid, terephthalic acid, tetrahydrophthalic acid, hexahydrophthalic acid, endomethylene tetrahydrophthalic acid, endomethylene hexahydrophthalic acid, trimellitic acid, and polymerized fatty acids; glycidylaminoglycidyl ethers obtained from aminophenols and aminoalkylphenols; glycidylaminoglycidyl esters obtained from aminobenzoic acids; glycidylamines obtained from aniline, toluidine, tribromoaniline, xylylenediamine, diamino cyclohexane, bisaminomethylcyclohexane, 4,4'-diaminodiphenyl methane, and 4,4'-diaminodiphenyl sulfone; epoxydized polyolefins; and the like.

Among these, it is preferred to use an alicyclic epoxy compound that can surely give a light transparency to the cured product suitable for the mounting and the like of an LED element, Specific examples include a hydrogenated product of glycidyl bisphenol A (glycidyl hexahydrobisphenol A), 3,4-epoxycyclohexenylmethyl-3',4'-epoxycyclohexene carboxylate, and tris(2,3-epoxypropyl)isocyanurate (TEPIC).

As the curing agent, a known agent may be used as an epoxy compound curing agent. Further, a latent curing agent may also be used. For example, an acid anhydride curing agent, an amine curing agent, an imidazole curing agent and the like may be used. Among these, it is preferred to use an alicyclic acid anhydride curing agent that can surely give a light transparency suitable to the cured product suitable for the mounting and the like of an LED element. Specific examples include methylhexahydrophthalic anhydride.

Regarding the used amount of the epoxy compound and the curing agent in the epoxy adhesive, if the used amount of the curing agent is too low, the content of uncured epoxy compound tends to increase, while if the used amount of the curing agent is too much, the adhesion target material tends to corrode due to the influence of excessive curing agent. Therefore, it is preferred to use the curing agent in a ratio of 80 to 120 parts by mass, and more preferably 95 to 105 parts by mass, based on 100 parts by mass of the epoxy compound.

In the present invention, in addition to the epoxy compound and the curing agent, it is preferred to include a polymer compound in the epoxy adhesive to lessen internal stress. Since the effect of lessening internal stress decreases if the weight average molecular weight of the polymer compound is either too small or too large, it is preferred to use a polymer compound having a weight average molecular weight of 5000 to 200000, and more preferably 10000 to 100000, In addition, since the effect of lessening internal stress decreases if the glass transition temperature is too high, it is preferred to use a polymer compound having a glass transition temperature of 50° C. or less, and more preferably −30 to 10° C.

Specific examples of such a polymer compound include acrylic resins, rubbers (NBR, SBR, NR, SIS, or a hydrogenation product thereof), and olefin resins. Furthermore, these polymer compounds preferably have a functional group such as a glycidyl group and an amino group. From the perspective of exhibiting good heat resistance, examples of preferred polymer compounds include acrylic resins. Specific examples of acrylic resins include a resin obtained by copolymerizing 10 to 100 parts by mass, and more preferably 10 to 40 parts by mass, of glycidyl methacrylate or diethylaminoethyl acrylate, based on 100 parts by mass of ethyl acrylate.

If the used amount of such a polymer compound in the epoxy adhesive is too low, the effect of lessening internal stress tends to decrease, while if the used amount is too much, it tends to be impossible to maintain the conduction reliability. Therefore, the used amount of this polymer compound is preferably 10 to 50 parts by mass, and more preferably 10 to 30 parts by mass, based on a total of 100 parts by mass of the epoxy compound, the curing agent, and the polymer compound.

An imidazole compound may optionally be further blended in the epoxy adhesive as a curing accelerator. Specific examples of the imidazole compound include 2-ethyl-4-methyl imidazole. If the used amount of this imidazole compound is too low, the uncured component tends to increase, while if the used amount is too much, the adhesion target material tends to corrode due to the influence of excessive curing accelerator. Therefore, the used amount of this imidazole compound is preferably 0.01 to 10 parts by mass, and more preferably 0.1 to 5 parts by mass, based on 100 parts by mass of the curing agent.

As the conductive particles constituting the epoxy adhesive, conductive particles conventionally used in anisotropic conductive adhesives may be used. For example, metal particles of gold, nickel, solder and the like, resin particles coated with a metal plating, and particles such as these further coated with an insulating thin film may be used as appropriate. The particle size of the conductive particles is, similar to conventional conductive particles, usually 3 to 10 μm, To ensure good anisotropic conduction properties and conduction reliability, it is preferred to use 1 to 100 parts by mass, and more preferably 10 to 50 parts by mass, of these conductive particles based on 100 parts by mass of epoxy adhesive.

Various additives also used in conventional anisotropic conductive adhesives may optionally be added to the anisotropic conductive adhesive according to the present invention. For example, a silane coupling agent, a filler, a UV absorber, an antioxidant and the like may be added.

The anisotropic conductive adhesive according to the present invention can be produced by uniformly dispersing conductive particles in an epoxy adhesive according to an ordinary method. During this process, the anisotropic conductive adhesive can be worked by an ordinary method into a form such as a paste, a film, and a highly viscous liquid. Furthermore, the anisotropic conductive adhesive is a thermosetting adhesive, which can usually be cured by heating to 150 to 250° C., The anisotropic conductive adhesive according to the present invention can be preferably used when connecting a chip part or various modules to a circuit substrate. In particular, a connection structure formed by flip-chip mounting an IC chip or a chip part, such as an LED element, on a circuit substrate using the anisotropic conductive adhesive according to the present invention can maintain a high conduction reliability between the circuit substrate and the chip part, even when a reliability test is carried out that involves heating of the mounted product, such as a lead-free solder reflow test, a thermal shock test (TCT), a high-temperature high-humidity test, and a pressure cooker test (PCT). Also, the adhesion between the circuit substrate and the chip part and the cured anisotropic conductive adhesive can be maintained in a good condition.

EXAMPLES

The present invention will now be described in more detail using the following example's.

Reference Example 1 (Production of Acrylic Resin A)

A four-pecked flask equipped with a stirrer and a condenser was charged with 100 g of ethylene acrylate (EA), 10 g of glycidyl methacrylate (GMA), 0.2 g of azobisbutyronitrile, 300 g of ethyl acetate,'and 5 g of acetone, and a polymerization reaction was carried out for 8 hours at 70° C. while stirring the mixture. The precipitated particles were removed by filtration, washed with ethanol, and dried to give acrylic resin A. The obtained acrylic resin A had a weight average molecular weight of 80000, and a glass transition temperature of −40° C.

Reference Example 2 (Production of Acrylic Resin B)

A four-necked flask equipped with a stirrer and a condenser was charged with 100 g of ethylene acrylate (EA), 10 g of dimethylaminoethyl acrylate (DMAEA), 0.2 g of azobisbutyronitrile, 300 g of ethyl acetate, and 5 g of acetone, and a polymerization reaction was carried out for 8 hours at 70° C. while stirring the mixture. The precipitated particles were removed by filtration, washed with ethanol, and dried to give acrylic resin B. The obtained acrylic resin B had a weight average molecular weight of 80000, and a glass transition temperature of 18° C.

Examples 1 to 4 and Comparative Examples 1 to 5

Anisotropic conductive adhesives were prepared by uniformly mixing the components shown in Table 1 with a planetary stirrer.

Evaluation Tests

The adhesive force, elastic modulus, and conduction reliability of the paste-like anisotropic conductive adhesives obtained in Examples 1 to 4 and Comparative Examples 1 to 5 were measured as follows.

<Adhesive Force Test>

A paste-like anisotropic conductive adhesive was coated to a thickness of 25 μm (dry thickness) onto a glass epoxy circuit substrate that had been subjected to Au flash plating on the Cu wiring portion. Then, an IC chip having 1.5 mm sides was placed on the coated circuit substrate. The structure was then subjected to thermocompression by heating for 30 seconds at 180° C. by a flip-chip bonder to obtain a connection structure. The adhesion strength (N/chip) of the connection structure IC chip immediately after the connection structure was obtained (initial), after reflow (260° C.), and after being left for 100 hours at 150° C. was measured using a die shear tester (Bond Tester PTR1100, Rhesca). The obtained results are shown in Table 1. Based on the conditions in this adhesive force test, in practical terms, it is preferred that the adhesive force is 50 N/chip or more.

<Elastic Modulus Measurement>

An anisotropic conductive adhesive was coated to a dry thickness of 80 μm on release-treated PET, and then cured by placing in an oven at 150° C. The cured product was peeled from the release-treated PET, and cut into a strip (specimen) 3.5 cm long and 0.4 cm wide. The elastic modulus (EM$^{35}$, EM$^{55}$, EM$^{95}$, or EM$^{150}$) at 35° C., 55° C., 95° C., or 150° C. of this specimen was measured using a dynamic viscoelasticity measuring instrument (DDV-01FP-W, A&D Company: tension mode, frequency 11 Hz, rate of temperature increase 5° C./minute), Furthermore, from the obtained results, the change rate in elastic modulus (ΔEM$^{55\text{-}95}$ or ΔEM$^{95\text{-}150}$) was calculated based on the expressions (6) and (7). The obtained results are shown in Table 1.

<Conduction Reliability Test>

A paste-like anisotropic conductive adhesive was coated to a thickness of 25 μm (dry thickness) onto a glass epoxy circuit substrate that had been subjected to Au flash plating on the Cu wiring portion. Then, an IC chip having 6.3 mm sides was placed on the coated circuit substrate. The structure was then thermocompressed by heating for 30 seconds at 180° C. by a flip-chip bonder. The conduction resistance of the connection structure immediately after it was obtained was measured by a four-terminal method. Subsequently, the conduction resistance of this connection structure was measured by carrying out a level 4 moisture absorption reflow test (moisture absorption conditions: left for 96 hours in a 30° C., 60% RH environment, reflow conditions: reflow peak temperature 260°) or a level 2 moisture absorption reflow test (moisture absorption conditions: left for 168 hours in a 85° C., 60% RH environment, reflow conditions: reflow peak temperature 260°). After this measurement, a thermal shock test (TCT; −55° C., 0.5 hours→125° C., 0.5 hours, 500 cycles) was performed on the connection structure, and then, the conduction resistance was again measured. Cases in which the conduction resistance was less than 1 Ω were evaluated as good (G), while cases in which the conduction resistance was equal to or more than 1 Ω were evaluated as no-good (NG). The obtained results are shown in Table 1.

TABLE 1

| Component Name (parts by mass) | Example | | | | Comparative Example | | | | |
|---|---|---|---|---|---|---|---|---|---|
| | 1 | 2 | 3 | 4 | 1 | 2 | 3 | 4 | 5 |
| Alicyclic Epoxy Compound*² | 50 | 39 | 28 | 50 | 50 | 22 | 90 | 50 | 42 |
| Acrylic Resin A*² | 10 | 30 | 50 | — | — | 60 | — | — | 2 |
| Acrylic Resin B*³ | — | — | — | 30 | — | — | — | — | — |
| Phenoxy Resin*⁴ | — | — | — | — | 10 | — | 10 | 10 | — |
| Curing Agent*⁵ | 40 | 31 | 22 | 40 | 40 | 18 | — | 40 | 56 |
| Curing Accelerator*⁶ | 1 | 1 | 1 | 1 | — | 1 | 10 | 1 | 1 |
| Conductive Particles*⁷ | 30 | 30 | 30 | 30 | 30 | 30 | 30 | 30 | 30 |
| Adhesive Fored (N/chip) | | | | | | | | | |
| Initial | 98.0 | 107.8 | 127.4 | 98.0 | 39.2 | 127.4 | 49.0 | 49.0 | 49.0 |
| After Reflow | 98.0 | 107.4 | 117.6 | 98.0 | 19.6 | 107.4 | 39.2 | 39.2 | 39.2 |
| 150° C., 100 h | 78.4 | 88.2 | 98.0 | 88.2 | 9.8 | 39.2 | 19.6 | 19.6 | 29.4 |
| Elastic Modulus (Mpa) | | | | | | | | | |
| EM$^{15}$ | 2600 | 1400 | 900 | 1600 | 3200 | 600 | 1900 | 1700 | 2100 |
| EM$^{55}$ | 2200 | 1100 | 700 | 1200 | 2900 | 400 | 1700 | 1700 | 1900 |
| EM$^{95}$ | 1500 | 830 | 500 | 800 | 2600 | 300 | 1500 | 1600 | 1500 |
| EM$^{250}$ | 800 | 270 | 200 | 400 | 2500 | 100 | 46 | 1300 | 1000 |
| Change rate in Elastic Modulus (%) | | | | | | | | | |
| ΔEM$^{55\text{-}95}$ | 32 | 25 | 29 | 33 | 10 | 25 | 12 | 6 | 21 |
| ΔEM$^{95\text{-}250}$ | 47 | 67 | 60 | 50 | 4 | 67 | 97 | 19 | 33 |
| Conduction Reliability | | | | | | | | | |
| Initial | G | G | G | G | G | NG | G | G | G |
| After Level 4 Moisture Absorption Reflow | G | G | G | G | G | — | G | G | G |

TABLE 1-continued

| Component Name | Example | | | | Comparative Example | | | | |
|---|---|---|---|---|---|---|---|---|---|
| (parts by mass) | 1 | 2 | 3 | 4 | 1 | 2 | 3 | 4 | 5 |
| After Level 2 Moisture Absorption Reflow | G | G | G | G | NG | — | NG | NG | NG |
| After 500 Cycles of TCT | G | G | G | G | — | — | — | — | — |

*[1]Glycidyl hexahydrobisphenol A (YX8000, JER)
*[2]Reference Example 1
*[3]Reference Example 2
*[4]Weight average molecular weight 3700, glass transition temperature 70° C., Toto Kasei Co., Ltd.
*[5]Methylhexahydrophthalic anhydride
*[6]2-Ethyl-4-methyl imidazole (Shikoku Chemicals Corporation)
*[7]Particles having Ni/Au plating on the surface of 5 μm diameter crosslinked polystyrene particles From Table 1, it can be seen that the anisotropic conductive adhesives of Examples 1 to 5, whose cured products had elastic modulus satisfying the following expressions (1) to (5), exhibited good results for initial adhesive force, adhesive force after performing reflow test, and adhesive force after 100 hours at 150'C. Furthermore, Examples 1 to 5 also exhibited good results for initial conduction reliability, conduction reliability after performing the level 4 moisture absorption reflow, conduction reliability after performing the level 2 moisture absorption reflow, and conduction reliability after 500 cycles of thermal shock.

$$700 Mpa \leq EM^{35} \leq 3000 MPa \quad (1)$$

$$EM^{150} < EM^{95} < EM^{55} < EM^{35} \quad (2)$$

$$\Delta EM^{55-95} < \Delta EM^{95-150} \quad (3)$$

$$20\% \leq \Delta EM^{55-95} \quad (4)$$

$$40\% \leq \Delta EM^{95-150} \quad (5)$$

In contrast, in Comparative Example 1, since the $EM^{35}$ was more than 3000 MPa, the expression (1) was not satisfied. Moreover, Comparative Example 1 did not satisfy the expressions (3) to (5). Therefore, not only adhesive force, but the desired conduction reliability also could not be achieved after the moisture absorption reflow test carried out under more severe conditions.

In Comparative Example 2, the $EM^{35}$ was less than 700 MPa, and thus the expression (1) was not satisfied. Therefore, the desired adhesive force could not be obtained after leaving for 100 hours at 150° C. Further, the desired conduction reliability could not be obtained immediately after the connection structure was produced.

In Comparative Example 3, the change rate in elastic modulus $\Delta EM^{55-95}$ was less than 20%, and thus the expression (4) was not satisfied. Therefore, the desired adhesive force could not be obtained after performing ref low test and after leaving for 100 hours at 150° C. Furthermore, the desired conduction reliability could not be achieved after the moisture absorption reflow test carried out under more severe conditions.

In Comparative Example 4, the change rate in elastic modulus $\Delta EM^{35-95}$ was less than 20%, and the change rate in elastic modulus $\Delta EM^{95-150}$ was also less than 40%, so that the expressions (4) and (5) were not satisfied. Therefore, the desired adhesive force could not be obtained after performing reflow test and after leaving for 100 hours at 150° C. Furthermore, the desired conduction reliability could not be achieved after the moisture absorption reflow test carried out under more severe conditions.

In Comparative Example 5, the change rate in elastic modulus $\Delta EM^{95-150}$ was less than 40%, and thus the expression (5) was not satisfied. Therefore, the desired adhesive force could not be obtained after performing reflow test and after leaving for 100 hours at 150° C. Furthermore, the desired conduction reliability could not be achieved after the moisture absorption reflow test carried out under more severe conditions.

INDUSTRIAL APPLICABILITY

The anisotropic conductive adhesive according to the present invention is prepared such that the cured product thereof has elastic modulus which satisfies the expressions (1) to (5). Therefore, a high conduction reliability between a circuit substrate and a chip part can be maintained, and the adhesion between the circuit substrate and chip part and the cured anisotropic conductive adhesive can be maintained in a good condition, even when a mounted product obtained by mounting the chip part on the circuit substrate with the anisotropic conductive adhesive according to the present invention is subjected to a reliability test that involves heating of the mounted product, such as a lead-free solder reflow test, a thermal shock test (TCT), a high-temperature high-humidity test, and a pressure cooker test, (PCT). Therefore, the anisotropic conductive adhesive according to the present invention is useful in connecting a circuit substrate and various chips or an electronic part, such as a module and a flexible circuit substrate.

The invention claimed is:

1. An anisotropic conductive adhesive comprising an epoxy adhesive containing an acrylic resin obtained by copolymerizing 10 to 100 parts by mass of glycidyl methacrylate or diethylaminoethyl acrylate based on 100 parts by mass of ethyl acrylate, an epoxy compound and an alicyclic acid anhydride curing agent as a curing agent, and conducive particles dispersed in the epoxy adhesive, the acrylic resin having a weight average molecular weight of 5000 to 200000 and a glass transition temperature of 50° C. or less, wherein when elastic moduluses at 35° C., 55° C., 95° C., and 150° C. of a cured product of the anisotropic conductive adhesive are denoted by $EM^{35}$, $EM^{55}$, $EM^{95}$, and $EM^{150}$, respectively, and change rates in the elastic modulus between 55° C. and 95° C. and between 95° C. and 150° C. are denoted by $\Delta EM^{55-95}$ and $\Delta EM^{95-150}$, respectively, the following expressions (1) to (5) are satisfied $$700 Mpa \leq EM^{35} \leq 3000 MPa \quad (1)$$

$$EM^{150} < EM^{95} < EM^{55} < EM^{35} \quad (2)$$

$$\Delta EM^{55-95} < \Delta EM^{95-150} \quad (3)$$

$$20\% < \Delta EM^{55\text{-}95} \quad (4)$$

$$40\% < \Delta EM^{95\text{-}150} \quad (5).$$

2. The anisotropic conductive adhesive according to claim 1, wherein the change rates in the elastic modulus $\Delta EM^{55\text{-}95}$ and $\Delta EM^{95\text{-}150}$ satisfy the following expressions (4') and (5'), respectively.

$$20\% < \Delta EM^{55\text{-}95} < 35\% \quad 4'$$

$$40\% < \Delta EM^{95\text{-}150} < 70\% \quad 5'$$

3. The anisotropic conductive adhesive according to claim 1, wherein the epoxy adhesive contains 80 to 120 parts by mass of the curing agent based on 100 parts by mass of the epoxy compound.

4. The anisotropic conductive adhesive according to claim 1, wherein a used amount of the acrylic resin in the epoxy adhesive is 10 to 50 parts by mass based on a total of 100 parts by mass of the epoxy compound, the curing agent, and the acrylic resin.

5. The anisotropic conductive adhesive according to claim 1, wherein the epoxy compound is an alicyclic epoxy compound.

6. The anisotropic conductive adhesive according to claim 5, wherein the alicyclic epoxy compound is a hydrogenated product of glycidyl bisphenol A or 3,4-epoxycyclohexenylmethyl-3',4'-epoxycyclohexene carboxylate, and the alicyclic acid anhydride curing agent is methylhexahydrophthalic anhydride.

7. The anisotropic conductive adhesive according to claim 1, wherein 2-methyl-4-ethyl imidazole is contained as a curing accelerator in an amount of 0.01 to 10 parts by mass based on 100 parts by mass of the curing agent.

8. A connection structure formed by flip-chip mounting a chip part on a circuit substrate using the anisotropic conductive adhesive according to claim 1.

9. The connection structure according to claim 8, wherein the chip part is an LED element.

10. An anisotropic conductive adhesive comprising an epoxy adhesive containing an acrylic resin obtained by copolymerizing 10 to 100 parts by mass of glycidyl methacrylate or diethylaminoethyl acrylate based on 100 parts by mass of ethyl acrylate, an epoxy compound and an alicyclic acid anhydride curing agent as a curing agent, and conducive particles dispersed in the epoxy adhesive, the acrylic resin having a weight average molecular weight of 5000 to 200000 and a glass transition temperature of 50° C. or less, wherein when elastic moduluses at 35° C., 55° C., 95° C., and 150° C. of a cured product of the anisotropic conductive adhesive are denoted by $EM^{35}$, $EM^{55}$, $EM^{95}$, and $EM^{150}$, respectively, and change rates in the elastic modulus between 55° C. and 95° C. and between 95° C. and 150° C. are denoted by $\Delta EM^{55\text{-}95}$ and $\Delta EM^{95\text{-}150}$, respectively, the following expressions (1) to (5) are satisfied:

$$700\text{Mpa} \le EM^{35} \le 3000\text{MPa} \quad (1)$$

$$EM^{150} < EM^{95} < EM^{55} < EM^{35} \quad (2)$$

$$\Delta EM^{55\text{-}95} \text{ and } \Delta EM^{95\text{-}150} \quad (3)$$

$$20\% < \Delta EM^{55\text{-}95} \quad (4)$$

$$40\% < \Delta EM^{95\text{-}150} \quad (5),$$

and wherein: the epoxy adhesive contains 80 to 120 parts by mass of the curing agent based on 100 parts by mass of the epoxy compound; a used amount of the acrylic resin in the epoxy adhesive is 10 to 50 parts by mass based an a total of 100 parts by mass of the epoxy compound, the curing agent, and the acrylic resin; and 2-methyl-4-ethyl imidazole is contained as a curing accelerator in an amount of 0.01 to 10 parts by mass based on 100 parts by mass of the curing agent.

11. An anisotropic conductive adhesive comprising an epoxy adhesive containing an acrylic resin obtained by copolymerizing 10 to 100 parts by mass of diethylaminoethyl acrylate based on 100 parts by mass of ethyl acrylate, an epoxy compound and a curing agent, and conducive particles dispersed in the epoxy adhesive, the acrylic resin having a weight average molecular weight of 5000 to 200000 and a glass transition temperature of 50° C. or less, wherein when elastic moduluses at 35° C., 55° C., 95° C., and 150° C. of a cured product of the anisotropic conductive adhesive are denoted by $EM^{35}$, $EM^{55}$, $EM^{95}$, and $EM^{150}$, respectively, and change rates in the elastic modulus between 55° C. and 95° C. and between 95° C. and 150° C. are denoted by $\Delta EM^{55\text{-}95}$ and $\Delta EM^{95\text{-}150}$, respectively, the following expressions (1) to (5) are satisfied $$700\text{Mpa} \le EM^{35} \le 3000\text{MPa} \quad (1)$$

$$EM^{150} < EM^{95} < EM^{55} < EM^{35} \quad (2)$$

$$\Delta EM^{55\text{-}95} < \Delta EM^{95\text{-}150} \quad (3)$$

$$20\% < \Delta EM^{55\text{-}95} \quad (4)$$

$$40\% < \Delta EM^{95\text{-}150} \quad (5).$$

* * * * *